United States Patent [19]

Lur et al.

[11] Patent Number: 5,308,786
[45] Date of Patent: May 3, 1994

[54] TRENCH ISOLATION FOR BOTH LARGE AND SMALL AREAS BY MEANS OF SILICON NODULES AFTER METAL ETCHING

[75] Inventors: Water Lur, Taipei; Jiunn Y. Wu, Dou-Lio; Anna Su, Hsin-Chu, all of Taiwan

[73] Assignee: United Microelectronics Corporation, Hsinchu, Taiwan

[21] Appl. No.: 127,052

[22] Filed: Sep. 27, 1993

[51] Int. Cl.⁵ .................................. H01L 21/76
[52] U.S. Cl. ............................ 437/67; 437/63; 437/64; 148/DIG. 50
[58] Field of Search ................ 437/67, 63, 64; 148/DIG. 50

[56] References Cited

U.S. PATENT DOCUMENTS

| | | | |
|---|---|---|---|
| 4,211,582 | 7/1980 | Horng et al. | 148/1.5 |
| 4,222,792 | 9/1980 | Lever et al. | 437/67 |
| 4,656,497 | 4/1987 | Rogers et al. | 357/50 |
| 4,836,885 | 6/1989 | Breiten et al. | 156/643 |
| 4,868,136 | 9/1989 | Ravaglia | 437/38 |
| 4,876,216 | 10/1989 | Tobias et al. | 437/67 |
| 4,988,639 | 1/1991 | Aomura | 437/67 |
| 5,017,999 | 5/1991 | Roisen et al. | 357/49 |
| 5,096,848 | 3/1992 | Kawamura | 437/67 |
| 5,108,946 | 4/1992 | Zdebel et al. | 437/72 |
| 5,130,268 | 7/1992 | Liou et al. | 437/67 |
| 5,175,122 | 12/1992 | Wang et al. | 148/DIG. 50 |

OTHER PUBLICATIONS

VLSI Technology, International Edition, by S. M. Sze, McGraw-Hill Book Co, pp. 473–474 and 476–477.
"Formation of Silicon Nitride At A Si–SiO₂ Interface during Local Oxidation of Silicon & during Heat–Treatment of Oxidized Silicon in NH₂Gas" by Kooi, J. G. van Lierop and J. A. Appels, J. Electrochem Soc. Solid–State Science and Technology, Jul. 1976, pp. 1117–1120.

Primary Examiner—Tom Thomas
Assistant Examiner—Trung Dang
Attorney, Agent, or Firm—George O. Saile

[57] ABSTRACT

A first insulating layer is deposited over the surface of a silicon substrate. Those portions of the first insulating layers not covered by a mask pattern are etched through to the silicon substrate so as to provide a plurality of wide and narrow openings exposing portions of the silicon substrate that will form the device isolation regions. A second insulating layer is deposited overlying the patterned first insulating layer. A layer of an aluminum-silicon alloy is deposited overlying the second insulating layer. The aluminum-silicon layer is etched away whereby silicon nodules are formed on the surface of the second insulating layer. The second insulating layer is etched through to the first insulating layer where it exists and to the silicon substrate surface where the substrate is exposed within the wide and narrow openings. A first set of narrow trenches is etched into the exposed portions of the silicon substrate within the wide and narrow openings using the silicon nodules as a mask. A third insulating layer is deposited over the surface of the substrate and within the first set of trenches. The third insulating layer is etched back to leave spacers on the sidewalls of the first set of trenches which fill the trenches. A second set of trenches is etched into the silicon substrate not covered by a mask wherein the second set of trenches is immediately contiguous with the first set of trenches and wherein the first and second sets of trenches together correspond to the wide and narrow openings.

43 Claims, 3 Drawing Sheets

TRENCH ISOLATION FOR BOTH LARGE AND SMALL AREAS BY MEANS OF SILICON NODULES AFTER METAL ETCHING

BACKGROUND OF THE INVENTION

1. FIELD OF THE INVENTION

This invention relates to the fabrication of integrated circuit devices and more particularly to a method of local oxidation by means of silicon nodules after metal etching in the fabrication of integrated circuits.

2. DESCRIPTION OF THE PRIOR ART

Local oxidation of silicon is the conventional lateral isolation scheme. The conventional local oxidation process (LOCOS) is described in *VLSI Technology*, International Edition, by S. M. Sze, McGraw-Hill Book Company, N.Y., N.Y., c. 1988 by McGraw-Hill Book Co., pp. 473-474. A layer of silicon nitride is deposited over a pad oxide overlying a silicon substrate. The pad oxide is a thin thermal oxide which allows better adhesion between the nitride and silicon and acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

On pp. 476-477 of the aforementioned textbook, Sze describes some of the disadvantages of the growth of field oxide using the local oxidation method. The field oxide will penetrate under the masking nitride layer causing the space between transistors to grow during oxidation. This oxide growth under nitride is called "bird's beak encroachment." Other problems include stress in the oxide in the region covered by the nitride mask, white ribbon effect (a narrow region of nonoxidized silicon), thinning of the field oxide in narrow openings, and a non-recessed surface.

Many new isolation processes have been developed to overcome these drawbacks. Trench isolation schemes are the most attractive candidates. Typically, deep narrow trenches are used to isolate one device from another. Shallow trenches are used to isolate elements within a device, and wide trenches are used in areas where interconnection patterns will be deposited. Unfortunately, simple trench isolation method cannot be implemented on large area openings. A number of solutions to this problem have been proposed. U.S. Pat. Nos. 4,836,885 to Breiten et al and 4,876,216 to Tobias et al describe methods for overcoming trench isolation problems using resist etchback techniques. U.S. Pat. No. 4,656,497 to Rogers et al uses reflow of doped glass at high temperatures. U.S. Pat. Nos. 5,017,999 to Roisen et al, 5,108,946 to Zdebel et al, and 5,130,268 to Liou et al describe using reoxidation of solid-phase growth polysilicon. U.S. Pat. Nos. 4,211,582 to Horng et al and 4,988,639 to Aomura use two step oxidation with plurality mask techniques and U.S. Pat. Nos. 4,868,136 to Ravaglia and 5,096,848 to Kawamura describe a combination of LOCOS and trench techniques. However, in each of these processes there exist some inherent drawbacks such as productivity, repeatability, complexity, and maturity, as well as global planarization.

SUMMARY OF THE INVENTION

A principal object of the invention is to provide an effective and very manufacturable method to locally oxidize the silicon in an integrated circuit.

Another object of the present invention is to provide a method of local oxidation of silicon that will have no "bird's beak" or white ribbon effect.

Yet another object is to provide a method of local oxidation which is free of oxide thinning in narrow openings.

Yet another object of the invention is to provide a method of locally oxidizing the silicon in an integrated circuit whereby a minimum of stress is generated.

Yet another object is to provide a method of local oxidation which incorporates global planarization.

In accordance with the objects of this invention, a new method of local oxidation by means of silicon nodules after metal etching is achieved. A first insulating layer is deposited over the surface of a silicon substrate. Those portions of the first insulating layers not covered by a mask pattern are etched through to the silicon substrate so as to provide a plurality of wide and narrow openings exposing portions of the silicon substrate that will form the device isolation regions. A second insulating layer is deposited overlying the patterned first insulating layer. A layer of an aluminum-silicon alloy is deposited overlying the second insulating layer. The aluminum-silicon layer is etched away whereby silicon nodules are formed on the surface of the second insulating layer. The second insulating layer is etched through to the first insulating layer where it exists and to the silicon substrate surface where the substrate is exposed within the wide and narrow openings. The silicon nodules are used as an etching mask. A first set of narrow trenches is etched into the exposed portions of the silicon substrate within the wide and narrow openings using the silicon nodules as a mask. Channel-stops are selectively ion implanted through the openings into the substrate underneath the first set of trenches. The remaining first and second insulating layers are removed. A third insulating layer is deposited over the surface of the substrate and within the first set of trenches. The third insulating layer is etched back to leave spacers on the sidewalls of the first set of trenches wherein the spacers fill the narrow first set of trenches. A second set of trenches is etched into the silicon substrate not covered by a photoresist mask and the spacers wherein the second set of trenches is immediately contiguous with the first set of trenches and wherein the first and second sets of trenches together correspond to the wide and narrow openings. A fourth insulating layer is deposited over the surface of the substrate and within the trenches. The fourth insulating layer is etched back to leave a second set of spacers on the sidewalls of the trenches wherein the spacers completely fill the trenches. The wide and narrow trenches are filled with the third and fourth insulating layers completing the device isolation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
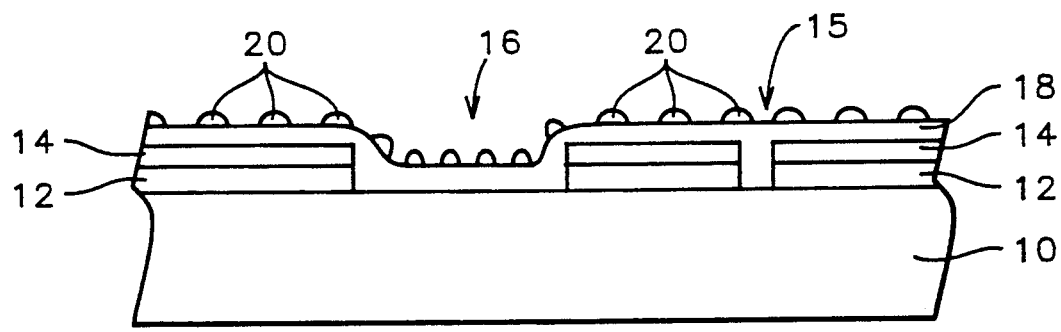
FIGS. 1 through 4 schematically illustrate in cross-sectional representation one preferred embodiment of this invention.

Referring now more particularly to FIG. 1, the first preferred embodiment will be described. There is shown a monocrystalline silicon substrate 10. A layer 12 of silicon dioxide or silicon nitride is chemically vapor deposited (CVD) or thermally grown on the surface of the substrate to a preferred thickness of between about 1000 to 4000 Angstroms. A layer 14 of polysilicon is deposited by CVD over the silicon dioxide or silicon nitride insulating layer 12. A field oxide (FOX) mask pattern is laid over the surface of the substrate and the layers 12 and 14 are etched to provide narrow openings 15 and wide openings 16 to expose portions of the silicon substrate where the device isolation regions are to be formed. A second insulating layer of silicon dioxide or silicon nitride 18 is deposited by CVD to a preferred thickness of between about 1000 to 4000 Angstroms over the patterned surface of the substrate.

A layer of aluminum-silicon alloy AL-Si(2%) is sputter deposited at a temperature of 450° C. or greater to a thickness of between about 10,000 to 20,000 Angstroms over the surface of the second insulating layer 18. The metal alloy layer is reactive ion etched using $BCl_3$, $Cl_2$, or the like until all of the metal has been removed. The solubility of Si in Al is less than 0.1% at room temperature. The silicon content precipitates during the cooling stage after deposition at high temperatures. The silicon precipitates are found to distribute randomly at the aluminum grain boundaries and at the interface of the aluminum and the underlayer. It is well known that it is difficult to etch silicon during metal etching and silicon nodules 20 are always observed thereafter. An additional overetch step to get rid of these silicon nodules is necessary in metal etching. Since the solubility of aluminum in silicon is very tiny at room temperature, these silicon nodules 20 are nearly pure silicon in composition.

Figure 2:
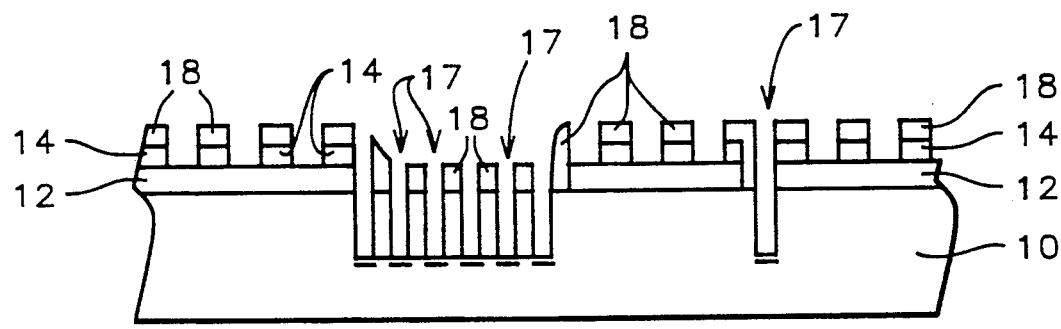

Referring now to FIG. 2, a reactive ion etch using $C_2F_6$ or the like is used to etch through the second insulating layer 18 to the polysilicon layer 14 where it exists and to the silicon substrate 10 in those portions under openings 15 and 16. The silicon nodules 20 act as an etching mask. Next, the exposed silicon substrate 10 is etched by a reactive ion etch or plasma etch using $Cl_2$, HBr, $O_2$, or the like to form narrow trenches 17 which are between about 4000 to 20,000 Angstroms deep. The second insulating layer 18 acts as a mask for this etch. The silicon nodules are also removed by this etch.

Channel-stops 22 are selectively ion implanted into the substrate through the narrow trenches 17. Boron ions are implanted with a dosage of between about 1 E 13 to 1 E 14 atoms/$cm^2$ and at an energy of between about 10 to 50 KeV. The channel-stop implants serve to prevent inversion of p-type silicon under the field oxide.

The second insulating layer 18 is stripped by a hydrofluoric acid solution for silicon dioxide or a $H_3PO_4$ solution for silicon nitride. A third insulating layer of silicon dioxide is deposited over the surface of the substrate and within the narrow trenches 17. This layer is deposited to a thickness of between about 3000 to 6000 Angstroms. This layer is etched by a reactive ion etch to form spacers 24 on the sidewalls of the trenches 17. The narrow trenches are completely filled by the spacers 24.

Figure 3:
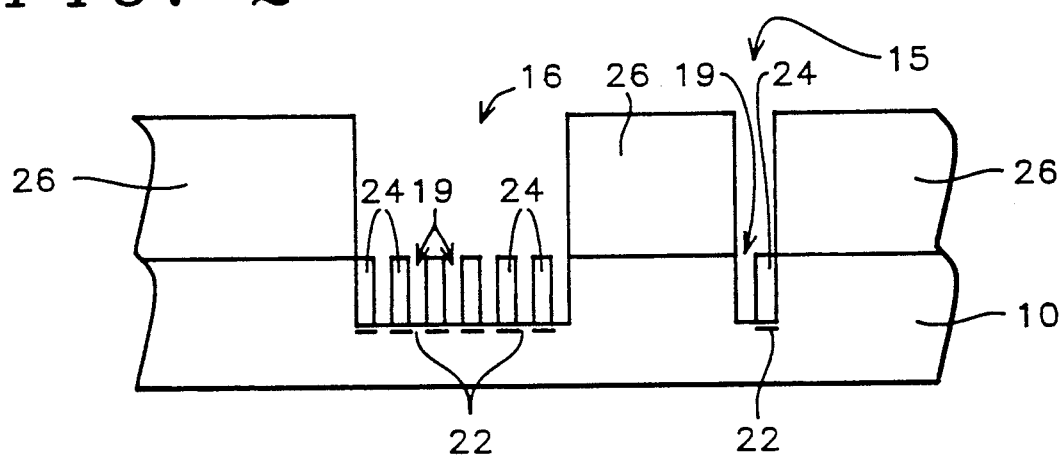

Referring to FIG. 3, a layer of photoresist 26 is deposited over the surface of the substrate and patterned using the same FOX mask used to form the openings 15 and 16. A second set of narrow trenches 19 are formed within the openings 15 and 16 next to the filled trenches 17. The spacers 24 filling trenches 17 along with the photoresist 26 act as an etching mask. The trenches are etched as above to a depth of between about 4000 to 20,000 Angstroms.

Figure 4:
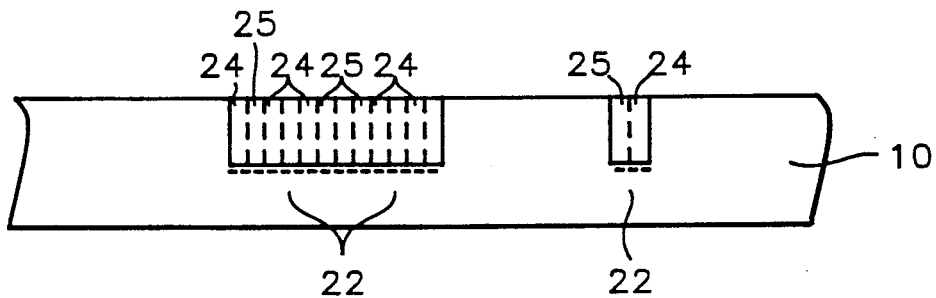
Figure 5:
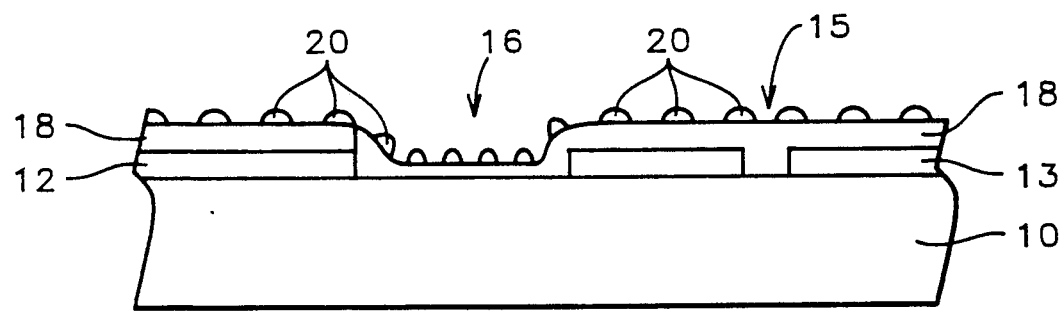
FIGS. 5 through 8 schematically illustrate in cross-sectional representation a second preferred embodiment of this invention.

A second channel-stop implantation after the second trench etching is not necessary since those dopants could diffuse to a moderate distance during the subsequent thermal cycles to play the role of channel stopping. Referring now to FIG. 4, the photoresist 26 is removed. A fourth insulating layer of silicon dioxide is deposited over the surface of the substrate to a thickness of between about 3000 to 6000 Angstroms. This layer is etched by a reactive ion etch to leave spacers 25 on the sidewalls of the trenches 19. These spacers fill the narrow trenches resulting in completely filled trenches within the narrow and wide openings 15 and 16.

FIGS. 5 through 8 illustrate the second preferred embodiment of the present invention. As in the first embodiment, there is shown a monocrystalline silicon substrate 10. A layer 13 of silicon nitride $Si_3N_4$ is chemically vapor deposited (CVD) on the surface of the substrate to a preferred thickness of between about 2000 to 3000 Angstroms. A field oxide (FOX) mask pattern is laid over the surface of the substrate and the silicon nitride layer 13 is etched to provide narrow openings 15 and wide openings 16 to expose portions of the silicon substrate where the device isolation regions are to be formed. A second insulating layer of silicon dioxide 18 is deposited by CVD to a preferred thickness of between about 1000 to 2000 Angstroms over the patterned surface of the substrate.

A layer of aluminum-silicon alloy AL-Si(2%) is sputter deposited at a temperature of 450° C. or greater to a thickness of between about 10,000 to 20,000 Angstroms over the surface of the second insulating layer 18. The metal alloy layer is reactive ion etched using $BCl_3$, $Cl_2$, or the like until all of the metal has been removed. As described above, silicon nodules 20 are formed on the surface of the silicon dioxide layer 18.

Figure 6:
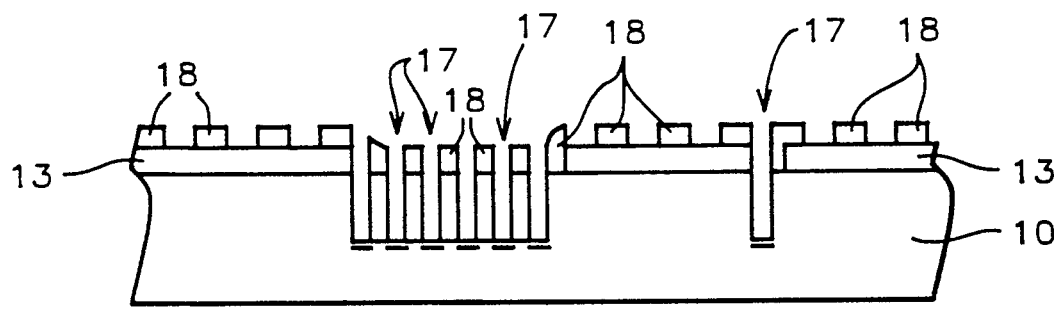

Referring now to FIG. 6, a reactive ion etch using $C_2F_6$ or the like is used to etch through the second insulating layer 18 to the silicon nitride layer 13 where it exists and to the silicon substrate 10 in those portions under openings 15 and 16. The silicon nodules 20 act as an etching mask. Next, the exposed silicon substrate 10 is etched by a reactive ion etch or plasma etch using $Cl_2$, HBr, $O_2$, or the like to form narrow trenches 17 which are between about 4000 to 20,000 Angstroms deep. The second insulating layer 18 and the silicon nitride layer 13 act as a mask for this etch. The silicon nodules are also removed by this etch.

Channel-stops 22 are selectively ion implanted into the substrate through the narrow trenches 17. Boron ions are implanted with a dosage of between about 1 E 13 to 1 E 14 atoms/$cm^2$ and at an energy of between about 10 to 50 KeV. The channel-stop implants serve to prevent inversion of p-type silicon under the field oxide.

The silicon dioxide layer 18 is stripped by a hydrofluoric acid solution. A third insulating layer of silicon dioxide is deposited over the surface of the substrate and within the narrow trenches 17. This layer is deposited to a thickness of between about 3000 to 6000 Angstroms. This layer is etched by a reactive ion etch to form spacers 24 on the sidewalls of the trenches 17. The narrow trenches are completely filled by the spacers 24.

Figure 7:
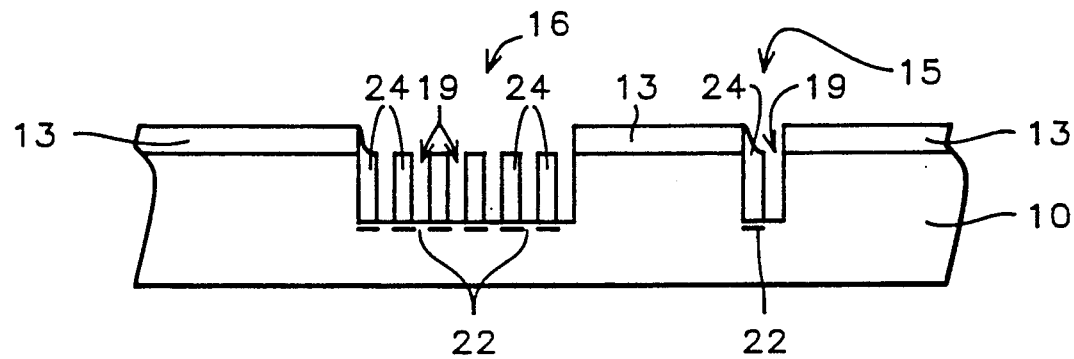

Referring to FIG. 7, a second set of narrow trenches 19 are formed within the openings 15 and 16 next to the filled trenches 17. The spacers 24 filling trenches 17 along with the silicon nitride layer 13 act as an etching mask. The trenches are etched as above to a depth of between about 4000 to 20,000 Angstroms.

Figure 8:
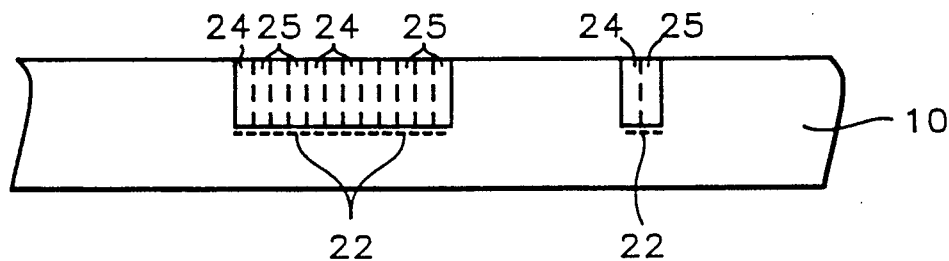

A second channel-stop implantation after the second trench etching is optional, as above. Referring now to FIG. 8, the silicon nitride layer 13 is removed by a $H_3PO_4$ solution. A fourth insulating layer of silicon dioxide is deposited over the surface of the substrate to a thickness of between about 3000 to 6000 Angstroms. This layer is etched by a reactive ion etch to leave spacers 25 on the sidewalls of the trenches 19. These spacers fill the narrow trenches resulting in completely filled trenches within the narrow and wide openings 15 and 16. optionally, the silicon nitride layer 13 could be removed after the spacer 25 formation.

This completes the device isolation of the integrated circuit. Both wide and narrow openings have been filled and planarized without thinning of oxide in narrow openings. No "bird's beak" or white ribbon effects are produced.

Figure 9:
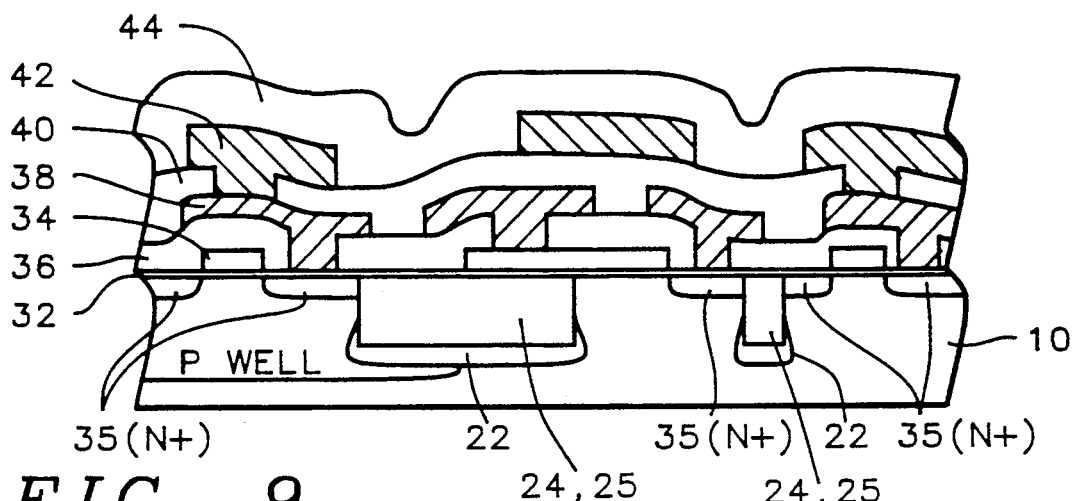
FIG. 9 schematically illustrates in cross-sectional representation a completed integrated circuit of the present invention.

The integrated circuit may be completed as is conventional in the art. For example, referring to FIG. 9, gate oxide layer 32 may be deposited followed by patterning to provide openings for buried contact regions. A threshold-adjust ion implant may be required at this point or before the growth of the gate oxide layer 32. Next, gate electrode 34 and source/drain regions 35 are fabricated. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of an intermetal dielectric layer 40. A second metallization 42 is deposited and patterned. A top capping layer 44 of silicon nitride and/or an oxide complete formation of the integrated circuit.

While the invention has been particularly shown and described with reference to the preferred embodiments thereof, it will be understood by those skilled in the art that various changes in form and details may be made without departing from the spirit and scope of the invention. Particularly, it should be understood that there are methods other than the two embodiment described above that can be used to complete this kind of trench isolation without departing from the spirit and scope of the invention.

What is claimed is:

1. The method of forming device isolation regions of an integrated circuit by means of silicon nodules after metal etching comprising:

providing a first insulating layer over the surface of a silicon substrate;

depositing a polysilicon layer overlying said first insulating layer;

etching through portions of said polysilicon layer and said first insulating layer not covered by a mask pattern to said silicon substrate so as to provide a plurality of wide and narrow openings exposing portions of said silicon substrate that will form the said device isolation regions;

depositing a second insulating layer overlying said patterned polysilicon and first insulating layers;

depositing a layer of an aluminum-silicon alloy overlying said second insulating layer;

etching away said aluminum-silicon layer whereby silicon nodules are formed on the surface of said second insulating layer;

etching through said second insulating layer and said polysilicon layer to said first insulating layer where it exists and to said silicon substrate surface where said substrate is exposed within said wide and narrow openings using said silicon nodules as a mask;

etching a first set of narrow trenches into said exposed portions of said silicon substrate within said wide and narrow openings using said second insulating layer as a mask wherein said silicon nodules are also etched away;

selectively ion implanting channel-stops through said openings into said substrate underneath said first set of trenches;

removing remaining said first and second insulating layers;

depositing a third insulating layer over the surface of said substrate and within said first set of trenches;

etching back said third insulating layer to leave spacers on the sidewalls of said first set of trenches wherein said spacers fill said narrow first set of trenches;

covering the surface of said substrate with a layer of photoresist and patterning said photoresist using same said mask pattern;

etching a second set of trenches into said silicon substrate not covered by said photoresist mask and said spacers wherein said second set of trenches are immediately contiguous with said first set of trenches and wherein said first and second sets of trenches together correspond to said wide and narrow openings;

removing said photoresist layer;

depositing a fourth insulating layer over the surface of said substrate and within said second set of trenches;

etching back said fourth insulating layer to leave a second set of spacers on the sidewalls of said second set of trenches wherein said spacers completely fill said trenches; and resulting in wide and narrow trenches filled with said third and fourth insulating layers completing said device isolation of said integrated circuit.

2. The method of claim 1 wherein said first insulating layer is composed of silicon dioxide and has a preferred thickness of between about 1000 to 4000 Angstroms.

3. The method of claim 1 wherein said first insulating layer is composed of silicon nitride and has a preferred thickness of between about 1000 to 4000 Angstroms.

4. The method of claim 1 wherein said polysilicon layer has a preferred thickness of between about 500 to 2000 Angstroms.

5. The method of claim 1 wherein said second insulating layer is composed of silicon dioxide and has a preferred thickness of between about 1000 to 4000 Angstroms.

6. The method of claim 1 wherein said second insulating layer is composed of silicon nitride and has a preferred thickness of between about 1000 to 4000 Angstroms.

7. The method of claim 1 wherein said aluminum-silicon alloy layer is composed of 2% silicon and is deposited at greater than 450° C. to a preferred thickness of between about 10,000 to 20,000 Angstroms.

8. The method of claim 1 wherein said aluminum-silicon layer is reactive ion etched whereby all aluminum is removed and whereby said silicon nodules are formed on the surface of said second insulating layer.

9. The method of claim 1 wherein said first set of narrow trenches are etched under said silicon nodules wherein the size of said trenches corresponds to the size of said silicon nodules which is between about 5000 to 10,000 Angstroms in width and wherein said trenches are etched to a depth of between about 4000 to 20,000 Angstroms.

10. The method of claim 1 wherein said channel-stop implantation uses boron ions with a dosage of between about 1 E 13 to 1 E 14 atoms/cm$^2$ and energy of between about 10 to 50 KeV.

11. The method of claim 1 wherein said third insulating layer is composed of silicon dioxide and is deposited to a thickness of between about 3000 to 6000 Angstroms.

12. The method of claim 1 wherein said second set of narrow trenches are etched between said first set of trenches by a reactive ion etch.

13. The method of claim 1 wherein said second set of narrow trenches are etched between said first set of trenches by a plasma etch.

14. The method of claim 1 wherein said fourth insulating layer is composed of silicon dioxide and has a preferred thickness of between about 3000 to 6000 Angstroms.

15. The method of forming device isolation regions of an integrated circuit by means of silicon nodules after metal etching comprising:
providing a first insulating layer over the surface of a silicon substrate;
etching through portions of said first insulating layer not covered by a mask pattern to said silicon substrate so as to provide a plurality of wide and narrow openings exposing portions of said silicon substrate that will form the said device isolation regions;
depositing a second insulating layer overlying said patterned first insulating layer;
depositing a layer of an aluminum-silicon alloy overlying said second insulating layer;
etching away said aluminum-silicon layer whereby silicon nodules are formed on the surface of said second insulating layer;
etching through said second insulating layer to said first insulating layer where it exists and to said silicon substrate surface where said substrate is exposed within said wide and narrow openings using said silicon nodules as a mask;
etching a first set of narrow trenches into said exposed portions of said silicon substrate within said wide and narrow openings using said second insulating layer as a mask wherein said silicon nodules are also etched away;
selectively ion implanting channel-stops through said openings into said substrate underneath said first set of trenches;
removing remaining said second insulating layer;
forming spacers on the sidewalls of said first set of trenches;
etching a second set of trenches into said silicon substrate not covered by said first insulating layer and said spacers wherein said second set of trenches are immediately contiguous with said first set of trenches and wherein said first and second sets of trenches together correspond to said wide and narrow openings;
removing said first insulating layer; and
forming spacers on the sidewalls of said second set of trenches resulting in wide and narrow trenches filled with said spacers completing said device isolation of said integrated circuit.

16. The method of claim 15 wherein said first insulating layer is composed of silicon nitride and has a preferred thickness of between about 2000 to 3000 Angstroms.

17. The method of claim 15 wherein said second insulating layer is composed of silicon dioxide and has a preferred thickness of between about 1000 to 2000 Angstroms.

18. The method of claim 15 wherein said aluminum-silicon alloy layer is composed of 2% silicon and is deposited at greater than 450° C. to a preferred thickness of between about 10,000 to 20,000 Angstroms.

19. The method of claim 15 wherein said aluminum-silicon layer is reactive ion etched whereby said aluminum is removed and whereby said silicon nodules are formed on the surface of said second insulating layer.

20. The method of claim 15 wherein said first set of narrow trenches are etched under said silicon nodules wherein the size of said trenches corresponds to the size of said silicon nodules which is between about 5000 to 10,000 Angstroms in width and wherein said trenches are etched to a depth of between about 4000 to 20,000 Angstroms.

21. The method of claim 15 wherein said channel-stop implantation uses boron ions with a dosage of between about 1 E 13 to 1 E 14 atoms/cm$^2$ and energy of between about 10 to 50 KeV.

22. The method of claim 15 wherein said spacers are formed by the steps of:
depositing a layer of silicon dioxide over the surface of said substrate and within said trenches; and
etching back said silicon dioxide layer to leave spacers on the sidewalls of said trenches wherein said spacers fill said narrow trenches.

23. The method of claim 22 wherein said silicon dioxide is deposited to a thickness of between about 3000 to 6000 Angstroms.

24. The method of claim 15 wherein said second set of narrow trenches are etched between said first set of trenches by a reactive ion etch.

25. The method of claim 15 wherein said second set of narrow trenches are etched between said first set of trenches by a plasma etch.

26. The method of forming device isolation regions of an integrated circuit by means of silicon nodules after metal etching comprising:
providing a first insulating layer over the surface of a silicon substrate;
etching through portions of said first insulating layer not covered by a mask pattern to said silicon substrate so as to provide a plurality of wide and narrow openings exposing portions of said silicon substrate that will form the said device isolation regions;

depositing a second insulating layer overlying said patterned first insulating layer;

depositing a layer of an aluminum-silicon alloy overlying said second insulating layer;

etching away said aluminum-silicon layer whereby silicon nodules are formed on the surface of said second insulating layer;

etching through said second insulating layer to said first insulating layer where it exists and to said aluminum-silicon substrate surface where said substrate is exposed within said wide and narrow openings using said silicon nodules as a mask;

etching a first set of narrow trenches into said exposed portions of said silicon substrate within said wide and narrow openings using said second insulating layer as a mask wherein said silicon nodules are also etched away;

selectively ion implanting channel-stops through said openings into said substrate underneath said first set of trenches;

removing remaining said second insulating layer;

forming spacers on the sidewalls of said first set of trenches;

etching a second set of trenches into said silicon substrate wherein said second set of trenches are immediately contiguous with said first set of trenches and wherein said first and second sets of trenches together correspond to said wide and narrow openings; and forming spacers on the sidewalls of said second set of trenches resulting in wide and narrow trenches filled with said spacers completing said device isolation of said integrated circuit.

27. The method of claim 26 wherein said first insulating layer is composed of a first layer of silicon dioxide with a preferred thickness of between about 1000 to 4000 Angstroms and an overlying second layer of polysilicon which has a preferred thickness of between about 500 to 2000 Angstroms.

28. The method of claim 27 wherein said second insulating layer is composed of silicon dioxide and has a preferred thickness of between about 1000 to 4000 Angstroms.

29. The method of claim 27 wherein said second insulating layer is composed of silicon nitride and has a preferred thickness of between about 1000 to 4000 Angstroms.

30. The method of claim 26 wherein said first insulating layer is composed of a first layer of silicon nitride with a preferred thickness of between about 1000 to 4000 Angstroms and an overlying second layer of polysilicon which has a preferred thickness of between about 500 to 2000 Angstroms.

31. The method of claim 30 wherein said second insulating layer is composed of silicon dioxide and has a preferred thickness of between about 1000 to 4000 Angstroms.

32. The method of claim 30 wherein said second insulating layer is composed of silicon nitride and has a preferred thickness of between about 1000 to 4000 Angstroms.

33. The method of claim 26 wherein said first insulating layer is composed of silicon nitride and has a preferred thickness of between about 2000 to 3000 Angstroms.

34. The method of claim 33 wherein said second insulating layer is composed of silicon dioxide and has a preferred thickness of between about 1000 to 2000 Angstroms.

35. The method of claim 26 wherein said aluminum-silicon alloy layer is composed of 2% silicon and is deposited at greater than 450° C. to a preferred thickness of between about 10,000 to 20,000 Angstroms.

36. The method of claim 26 wherein said aluminum-silicon layer is reactive ion etched whereby all aluminum is removed and whereby said silicon nodules are formed on the surface of said second insulating layer.

37. The method of claim 26 wherein said first set of narrow trenches are etched under said silicon nodules wherein the size of said trenches corresponds to the size of said silicon nodules which is between about 5000 to 10,000 Angstroms in width and wherein said trenches are etched to a depth of between about 4000 to 20,000 Angstroms.

38. The method of claim 26 wherein said channel-stop implantation uses boron ions with a dosage of between about 1 E 13 to 1 E 14 atoms/cm$^2$ and energy of between about 10 to 50 KeV.

39. The method of claim 26 wherein said spacers are formed by the steps of:

depositing a layer of silicon dioxide over the surface of said substrate and within said trenches; and etching back said silicon dioxide layer to leave spacers on the sidewalls of said trenches wherein said spacers fill said narrow trenches.

40. The method of claim 39 wherein said silicon dioxide is deposited to a thickness of between about 3000 to 6000 Angstroms.

41. The method of claim 27 wherein said second set of narrow trenches are formed by the steps of:

covering the surface of said substrate with a layer of photoresist and patterning said photoresist using same said mask pattern;

etching into said silicon substrate not covered by said photoresist mask and said spacers to form said second set of trenches; and removing said photoresist layer.

42. The method of claim 30 wherein said second set of narrow trenches are formed by the steps of:

covering the surface of said substrate with a layer of photoresist and patterning said photoresist using same said mask pattern;

etching into said silicon substrate not covered by said photoresist mask and said spacers to form said second set of trenches; and removing said photoresist layer.

43. The method of claim 33 wherein said second set of narrow trenches are formed by the steps of:

etching into said silicon substrate not covered by said first insulating layer and said spacers to form said second set of trenches; and removing said first insulating layer.

* * * * *